US006600939B1

United States Patent
Zhao

(10) Patent No.: US 6,600,939 B1
(45) Date of Patent: Jul. 29, 2003

(54) SUPERCONDUCTING TAPES

(75) Inventor: Rupeng Zhao, Carlingford (AU)

(73) Assignee: Metal Manufactures Limited, New South Wales (AU)

( * ) Notice: Subject to any disclaimer, the term of this patent is extended or adjusted under 35 U.S.C. 154(b) by 203 days.

(21) Appl. No.: 09/661,254

(22) Filed: Sep. 13, 2000

Related U.S. Application Data

(63) Continuation of application No. PCT/AU99/00180, filed on Mar. 18, 1999.

(30) Foreign Application Priority Data

Mar. 18, 1998 (AU) .............................................. 9805644

(51) Int. Cl.⁷ .............................. H01L 39/00; B23B 9/00
(52) U.S. Cl. ........................ 505/231; 505/234; 428/693; 428/701
(58) Field of Search .................................. 428/614, 608, 428/693, 699, 701, 702, 930; 505/230, 231, 234, 237, 704, 813

(56) References Cited

U.S. PATENT DOCUMENTS

| | | | |
|---|---|---|---|
| 4,994,435 A | * 2/1991 | Shiga et al. ............ 204/192.24 |
| 5,104,849 A | * 4/1992 | Shiga et al. ................. 428/209 |
| 5,122,507 A | * 6/1992 | Yamamoto et al. .......... 428/457 |
| 5,151,406 A | * 9/1992 | Sawada et al. .............. 428/457 |
| 5,189,260 A | 2/1993 | Finnemore et al. |
| 5,192,739 A | 3/1993 | Lay |
| 5,208,215 A | 5/1993 | Chen et al. |
| 5,232,908 A | * 8/1993 | Shiga et al. .............. 156/89.17 |
| 5,288,699 A | * 2/1994 | Sato ............................. 29/599 |
| 5,360,784 A | * 11/1994 | Kimura et al. ............ 174/125.1 |
| 5,398,398 A | 3/1995 | Williams et al. |
| 5,508,254 A | 4/1996 | Sato et al. |
| 5,516,753 A | 5/1996 | Ohkura et al. |
| 5,801,124 A | * 9/1998 | Gamble et al. .......... 174/125.1 |
| 5,846,910 A | 12/1998 | Funahashi et al. |
| 5,849,670 A | * 12/1998 | Nabatane et al. ......... 174/125.1 |
| 5,929,000 A | 7/1999 | Hahakura et al. |
| 5,987,342 A | 11/1999 | Scudiere et al. |
| 6,074,991 A | 6/2000 | Jenovelis et al. |
| 6,192,573 B1 | 2/2001 | Hahakura et al. |
| 6,271,474 B1 | 8/2001 | Fujikami et al. |
| 6,272,730 B1 | 8/2001 | Gherardi et al. |
| 6,284,979 B1 | 9/2001 | Malozemoff et al. |
| 6,344,430 B1 | * 2/2002 | Duperray et al. ......... 174/125.1 |
| 6,360,425 B1 | 3/2002 | Christopherson et al. |
| 6,370,405 B1 | * 4/2002 | Riley et al. ............... 427/376.2 |
| 6,381,832 B1 | 5/2002 | Kaneko |
| 6,387,852 B1 | * 5/2002 | Celik et al. .............. 427/376.2 |
| 6,466,805 B2 | 10/2002 | Balachandran et al. |
| 6,469,253 B1 | 10/2002 | Saga et al. |

FOREIGN PATENT DOCUMENTS

| | | | |
|---|---|---|---|
| EP | 0282286 A2 | * 9/1988 | ........... H01L/39/24 |
| EP | 0 356 969 A2 | 3/1990 | |
| EP | 0 357 779 A1 | 3/1990 | |
| JP | 6-309955 | 11/1994 | |
| JP | 10-223070 | 8/1998 | |
| JP | 11-25771 | 1/1999 | |
| JP | 11-25772 | 1/1999 | |
| WO | WO 00/02208 | 1/2000 | |
| WO | WO 01/71733 | 9/2001 | |

OTHER PUBLICATIONS

Abstract for Japanese Patent Publication No. 9259660A; Oct. 3, 1997.

* cited by examiner

*Primary Examiner*—Tom Dunn
*Assistant Examiner*—Colleen P. Cooke
(74) *Attorney, Agent, or Firm*—Volentine Francos, PLLC

(57) ABSTRACT

A composite superconducting tape which includes at least one constituent superconducting tape that may be a multiplicity of stacked and bonded tapes including a pair of exposed opposite major faces, and at least one outer layer of metal tape overlying and bonded to one of the exposed major faces. In the case where two outer layer metal tapes are included, the strength thereof differ.

24 Claims, 5 Drawing Sheets

SUPERCONDUCTING TAPES

CROSS REFERENCE TO RELATED APPLICATIONS

This is a continuation application of application Ser. No. PCT/AU99/00180, filed Mar. 18, 1999, the entire contents of which are hereby incorporated by reference for all purposes.

FIELD OF THE INVENTION

The present invention relates to a superconducting tape and in particular to a composite superconducting tape.

The invention has been developed primarily for use with high load current carrying cables and will be described hereinafter with reference to that application. It will be appreciated, however, that the invention is not limited to this particular field of use and is also applicable for use with coils, magnets, transformers, motors and generators as well as current carrying cables.

BACKGROUND OF THE INVENTION

Tapes comprising superconducting material, and referred to as superconducting tapes, are already known. These tapes generally comprise one or many superconducting filaments in or, in some cases on the surface of, a medium of silver or silver alloy. One main class of superconducting tape is referred to as powder-in-tube or PiT tape. It is known to make this PiT tape by drawing or otherwise reducing a tube of silver or silver alloy which is filled with a powder form of the superconducting material. This tube is then usually further drawn, rolled or otherwise formed into a thin tape.

Multifilamentary tapes are mostly made by grouping filled tubes in a common silver or silver alloy sheath at an intermediate stage of reduction.

Composite powder-in-tube tapes are sometimes made by stacking individual tapes and securing them together. This securement is achieved in some instances by a wrapping of tape or in other instances the tapes are diffusion bonded and all the elements of the tape are longitudinal.

One important superconducting oxide is known as BSCCO-2223, and is a compound oxide of bismuth, strontium, calcium, and copper. It is known that certain limited substitutions can be made to this compound. It should also be noted that this compound that can be considered a cuprate salt.

When tapes are used to carry alternating current, rather than direct current, the superconducting tapes do not exhibit zero power loss. Notwithstanding, these are small compared to those exhibited by normal metallic conductors. This power loss resulting from the carrying alternating current rather than direct current is called "AC loss". For an individual tape, the AC loss can be of the order of 100 microwatts per meter per ampere of critical current squared.

AC losses and various other properties of superconducting tapes are adversely affected by mechanical stresses, especially tensile stresses. This is a particular difficulty that arises from bending of the tapes such as that which occurs when the tapes are formed in to a cable. That is, the tapes are generally helically wound onto a former. In other applications, such as forming a coil, similar problems arise.

It is an object of the present invention, at least in the preferred embodiments, to overcome or substantially ameliorate one or more of the disadvantages of the prior art.

DISCLOSURE OF THE INVENTION

According to a first aspect of the invention there is provided a composite superconducting tape, characterised by at least one constituent superconducting tape including a pair of exposed opposite major faces and at least one outer layer metal tape overlying and bonded to one of the exposed major faces thereof with the proviso that if there are two such metal tapes bonded to the major faces they differ in a common strength property for selectively displacing the neutral flexural plane of the at least one constituent superconducting tape.

According to another aspect of the invention there is provided a composite superconducting tape including at least one constituent superconducting tape having two exposed opposite major faces, two opposite edges extending between the major faces and a flexural neutral plane extending substantially parallel to and intermediate the major faces, and an outer layer of metal tape bonded a first of the exposed major faces for selectively displacing the neutral flexural plane toward or away from the first major face.

Preferably, the composite tape is wound along a helical path onto a former such that the first metal tape includes a convex outer surface.

According to a second aspect of the invention there is provided a composite superconducting tape having a first major outer face and a second major outer face spaced from the first, characterised by at least one constituent superconducting tape and at least a first metal tape overlying and bonded to the first face whereby a bending of the composite superconducting tape such that the first major face is convex results in the at least one constituent superconducting tape being subject to a substantially compressive force.

Preferably, the composite superconducting tape includes a multiplicity of stacked and bonded constituent superconducting tapes. More preferably, the composite tape includes a second metal tape overlying and bonded to the second face.

Preferably also, in use, the composite tape is wound in the same direction about a former such that the first major face is convex and the second face is concave. More preferably, the first metal tape is formed from silver alloy and the second metal tape is formed from pure silver. In other embodiments, however, the metal tapes are formed from the same material and the first tape is thicker than the second tape.

Preferably, the first metal tape is flat and has a width not substantially greater than that of the superconducting tapes. In others embodiments, however, the width of the metal tapes is slightly less than the width of the superconducting tapes. In still further embodiments, the first tape is wider than the superconducting tapes. However, in this last embodiment, the protruding edges of the metal tape are preferably bent to form a channel section. It will be appreciated that although this would have structural advantages it would also adversely affect fill factor.

In some embodiments, use is made of silver foil or other compatible material which is wrapped around the stack and extending longitudinally.

Preferably, in embodiments having multiple constituent tapes, those tapes are stacked in a single stack. In other embodiments, however, the tapes are stacked in two or more parallel adjacent stacks. The latter configuration preferably includes one or two full width metal tapes or superconducting tapes to bridge from stack to stack. Those structures with exactly two parallel stacks appear from preliminary experiments to have superior AC loss characteristics.

According to another aspect of the invention there is provided a composite superconducting tape characterised by at least one constituent powder in tube superconducting tape and at least one outer layer of metal tape overlying and bonded to one of the major exposed faces thereof with the proviso that if there are two such metal tapes they differ in strength.

Preferably there are a multiplicity of stacked and bonded constituent superconducting tapes.

In use, the metal tape, or the stronger metal tape if there are two, needs to be on the convex side. A stronger tape may, for example, be a silver alloy tape and the weaker tape pure silver, or the tapes may differ in thickness.

Preferably, such metal tape is flat has a width not substantially greater than that of the superconducting tapes (it might be slightly less). However, if desired a wider metal tape which is, or subsequently becomes, bent to a channel section could be used; this would have structural advantages but would adversely affect fill factor. Similarly the use of silver foil (or other compatible material) wrapped around the stack but extending longitudinally is not excluded, but presently it is considered unnecessary and undesirable, especially as there tends always to be more silver than is useful at the edges of the constituent tapes. When there are multiple constituent tapes they may be stacked in a single stack or in two or more parallel adjacent stacks; the latter will normally require one or two full-width metal tapes (or, if desired, superconducting tapes) to bridge from stack to stack. At least structures with exactly two parallel stacks appear from preliminary experiments to have superior AC loss characteristics.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

BRIEF DESCRIPTION OF THE DRAWINGS

Preferred embodiments of the invention will now be described, by way of example only, with reference to the accompanying drawings in which.

PREFERRED EMBODIMENT OF THE INVENTION

Figure 1:
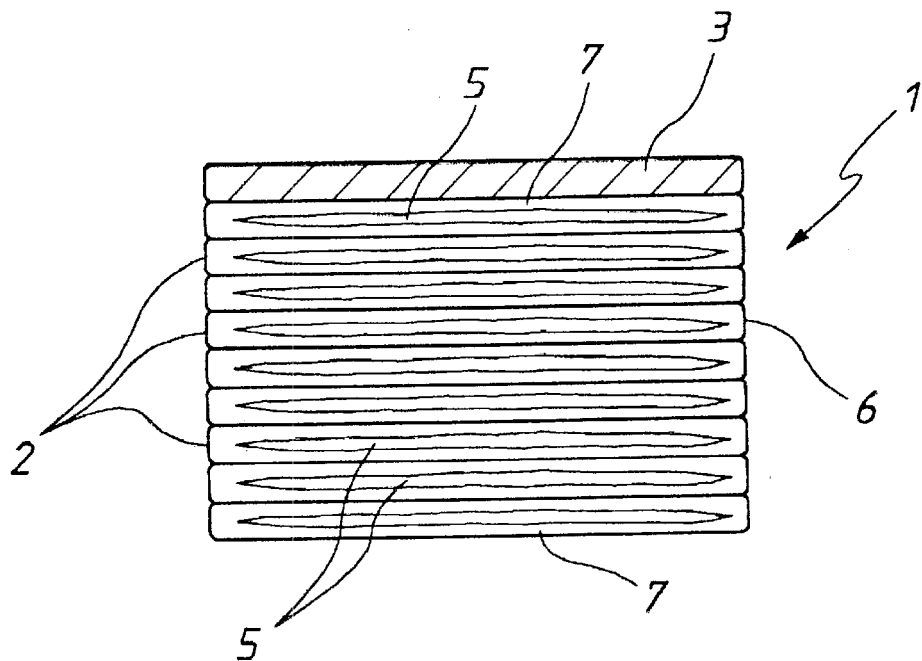
FIG. 1 is a cross-sectional view of a composite superconducting tape according to the invention with one metal tape.

The composite superconducting tape 1 shown in FIG. 1 has a width of between 4 and 5.5 mm and a thickness of about 0.27 mm and comprises (for example) eight stacked monofilamentary tapes 2 and a silver tape 3 all bonded together. Each monofilamentary tape 2 comprises a filament 5 of superconducting material, for example BSCCO-2223, in a silver/silver alloy cladding 7 as with known superconducting tapes. Typically (in the finished product as shown each individual monofilamentary tape 2 has a thickness of 35–40 $\mu$m and the filaments 5 themselves have thicknesses in the range 10 to 20 $\mu$m.

To make the composite superconducting tape 1, the required number of monofilamentary tapes 2 must be made. The monofilamentary tapes 2 are made by firstly packing BSCCO-2223 oxide powder (or more usually a precursor convertible to the BSCCO-2223 composition by heat-treatment) into a cleaned and dry tube of silver or silver alloy having an internal diameter of approximately 8 mm and an external diameter of approximately 10 mm. A length of between 4 cm and 6 cm—depending upon the length of the silver tube—at one end of the tube is then swagged, and the tip of the swagged end closed off using smaller swagging dies, to prevent powder loss during packing. After swagging, the tube is again dried. The prepared tube is then carefully filled with the superconducting powder (precursor) under dry argon in a glove box. The powder is added small amounts at a time and tamped down with a silver rod until the tube is full, at which point the tube is closed off using a plug of silver tape. After the tube has been packed with superconducting powder and sealed, then the tube is degassed by placing it in a cool oven, in air, raising the temperature to 830° C. and maintaining that temperature for five hours. The tube is then drawn in a number of stages down to a diameter of approximately 1.54 mm. The drawings are done in 23 steps in each of which the cross-sectional area of the tube is reduced by approximately 15%. During drawings, the tube is twice annealed at 500° C. for between 30 and 60 seconds, when its diameter is 2.51 mm and 1.96 mm respectively.

The 1.54 mm wire is then rolled in a rolling mill in stages, to successive smaller thicknesses using roll gaps of 1.05, 0.80, 0.65, 0.50, 0.40, 0.35, 0.30 0.25 and 0.22 mm, twice annealing for between 30 and 60 seconds at 500° C., at thicknesses of 0.65 mm and 0.35 mm respectively.

Figure 2:
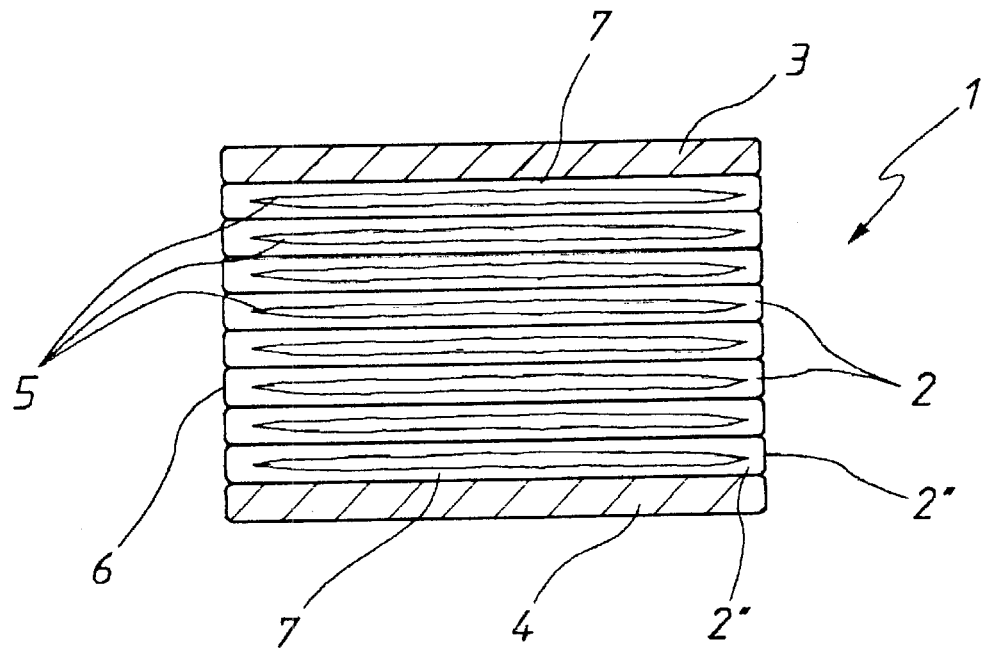
FIG. 2 is a cross-sectional view of another composite superconducting tape according to the invention with two metal tapes.

As illustrated in FIGS. 1 and 2, the tape 2 is then cut into nine strips of equal length and stacked one upon each other with the addition of a silver tape about 0.22 mm thick and the stack wound on a former of ceramic material (with ceramic paper strip interleaved to prevent bonding of turns). The wound assembly is then heated at 820° C. for about five hours to effect diffusion bonding and then, after it has cooled to room temperature, rolled in stages to 0.30 mm using successive roll gaps of 1.50, 0.95, 0.80, 0.65, 0.55, 0.45, 0.40, 0.35 and 0.30 mm and annealing under the same conditions as before at 1.10 mm and 0.65 mm.

The resulting composite tape 1 is then heated in air, starting with a cool oven, to 840° C. and held at that temperature for 50 hours, cooled to room temperature and rolled once on the same mill with a roll gap of 0.27 mm. Finally it is heat-treated in an atmosphere of 7.5% oxygen balance nitrogen, starting with a cold oven, heated to 825° C., held at that temperature for 40 hours and then cooled over a further period of 40 hours to 785° C. This heat-treatment regime serves to consolidate it, complete texturing and convert the precursor to the desired BSCCO-2223 phase without risking melting of any large volume fraction of the superconducting material.

The relatively strong metal tape 3 displaces the flexural neutral plane from the geometrical midplane towards itself.

The result is that, when the tape is curved in such a direction that the side with the metal tape is convex, most of the filaments will be under compressive strain, which is less detrimental than tensile strain.

The tape of FIG. 2 is broadly similar but has an outer layer 3 of silver on one major face and an outer layer 4 of silver alloy—typically comprising silver with 0.2% magnesium—on the other. These may each be about 0.22 mm thick when placed on the stack 6 of superconductor tapes 2 and at the end of the process have thicknesses of about 25 μm. The flexural neutral plane is in this case is displaced towards the stronger, alloy tape 4 and the tape should be used with its lower surface (as drawn) convex.

Figure 3:
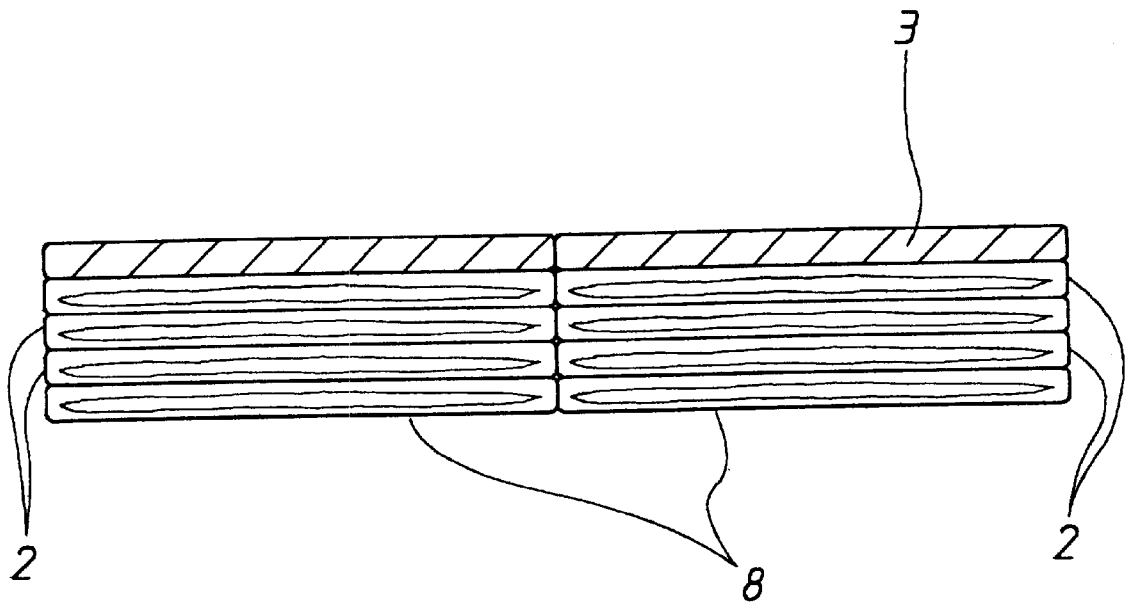
FIG. 3 illustrates a multi-column, composite superconducting tape according to the invention with a single metal tape.
Figure 4:
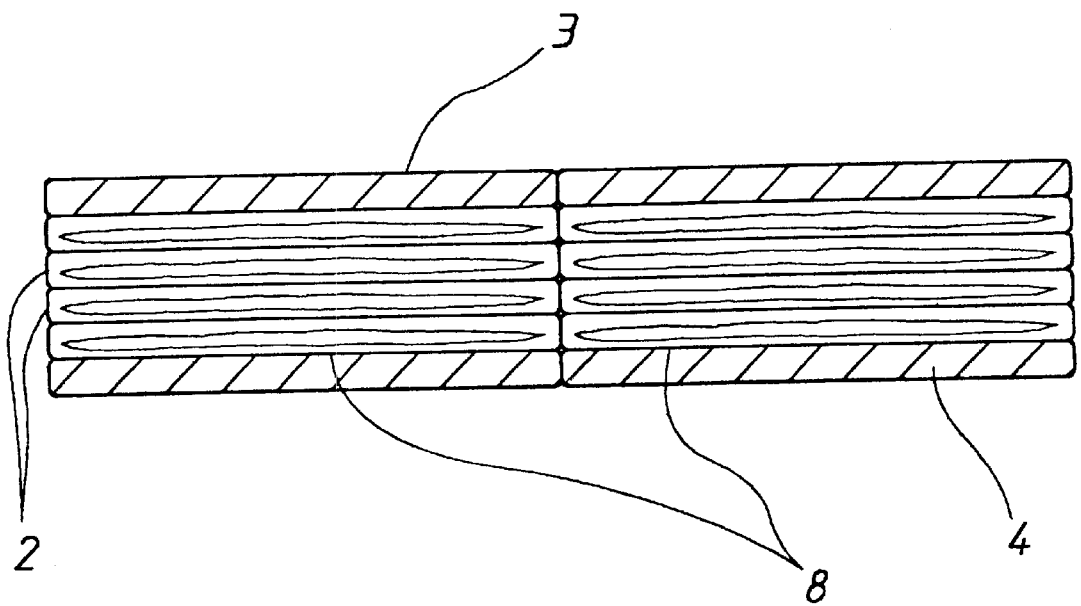
FIG. 4 illustrates another multi-column, composite superconducting tape according to the invention with two metal tapes.

FIGS. 3 and 4 show alternative designs which are similar to FIGS. 1 and 2 respectively, except that the constituent superconducting tapes 2 are arranged in two columns 8. Preliminary experiments indicate that this columnar structure has lower AC losses than comparable single-column tapes, perhaps because the filaments de-couple across the columns. It may be desirable to square the edges of the tapes (by trimming or otherwise) to minimise risk of creating voids between the columns.

Figure 5:
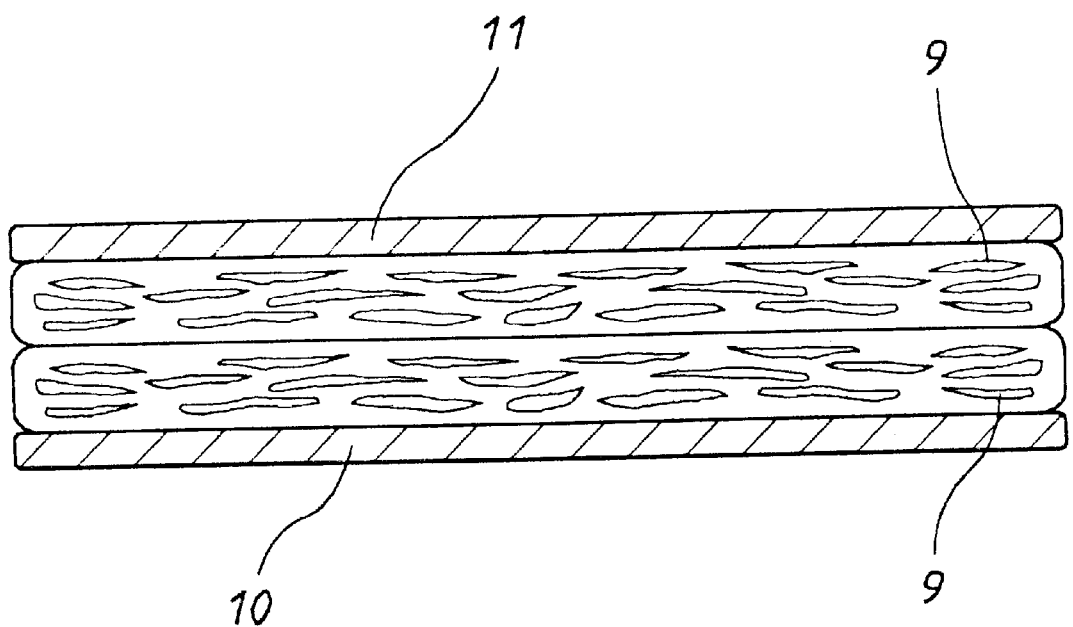
FIG. 5 illustrates a composite superconducting tape according to the invention with two multifilament tapes and two outer metal tapes.

The tape of FIG. 5 is comprised of two multifilamentary superconducting tapes 9 and two outer metal tapes 10, 11. Multifilamentary superconducting tape 9 is made by bundling the required number of monofilamentary wires, putting them into another silver or silver alloy tube, drawing to smaller sized wire and the rolling to flat tape using similar procedure described with respect to the tape shown in FIG. 1.

Figure 6:
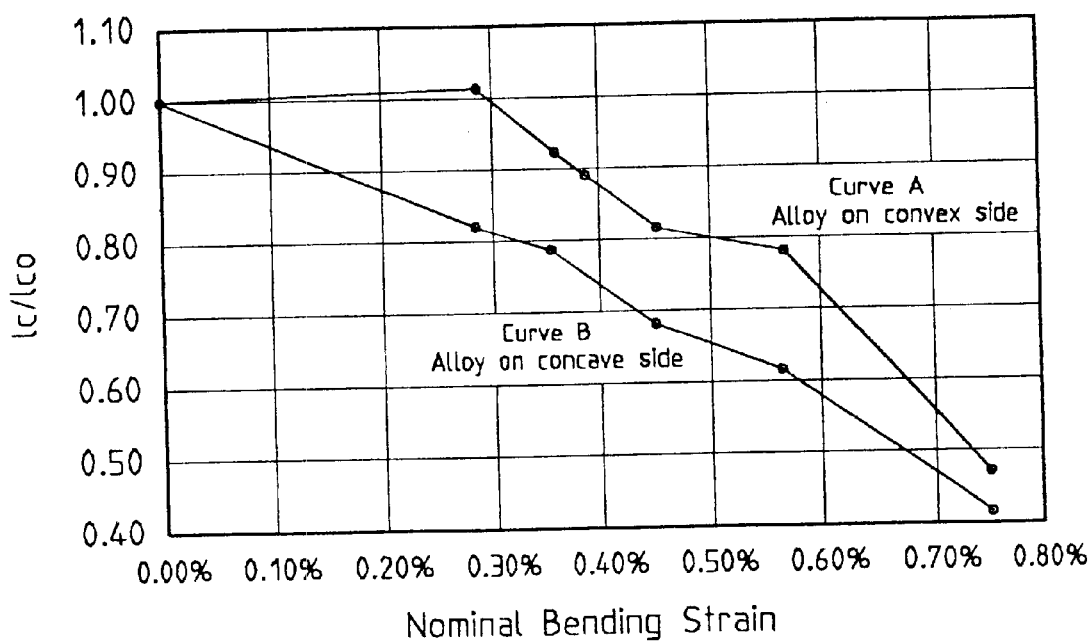
FIG. 6 presents a graph illustrating the effect on the critical current on a superconducting tape according to the invention as a function of nominal bending strain for alloy on either the concave or convex side.

FIG. 6 shows the critical current of a composite superconducting tape of the present invention versus nominal bending strain. The composite superconducting tape in this example consists of five monofilamentary tape, one outer Ag tape and one outer Ag-Mg alloy tape. The nominal bending strain $\epsilon(\%)$ was calculated based on the formula $$\epsilon(\%)=t/(2R+t)$$

where t is the thickness of the composite tape and R the radius of bending curvature. Ico is the critical current of the composite tape at its as-sintered state, and Ic the critical current of the composite tape after bending. Curve A shown in FIG. 6 represents Ic versus $\epsilon$ (%) when the tape is bent with the stronger Ag-Mg alloy tape on the convex side; and curve B represent the situation with the weaker Ag tape on the convex side.

Figure 7:
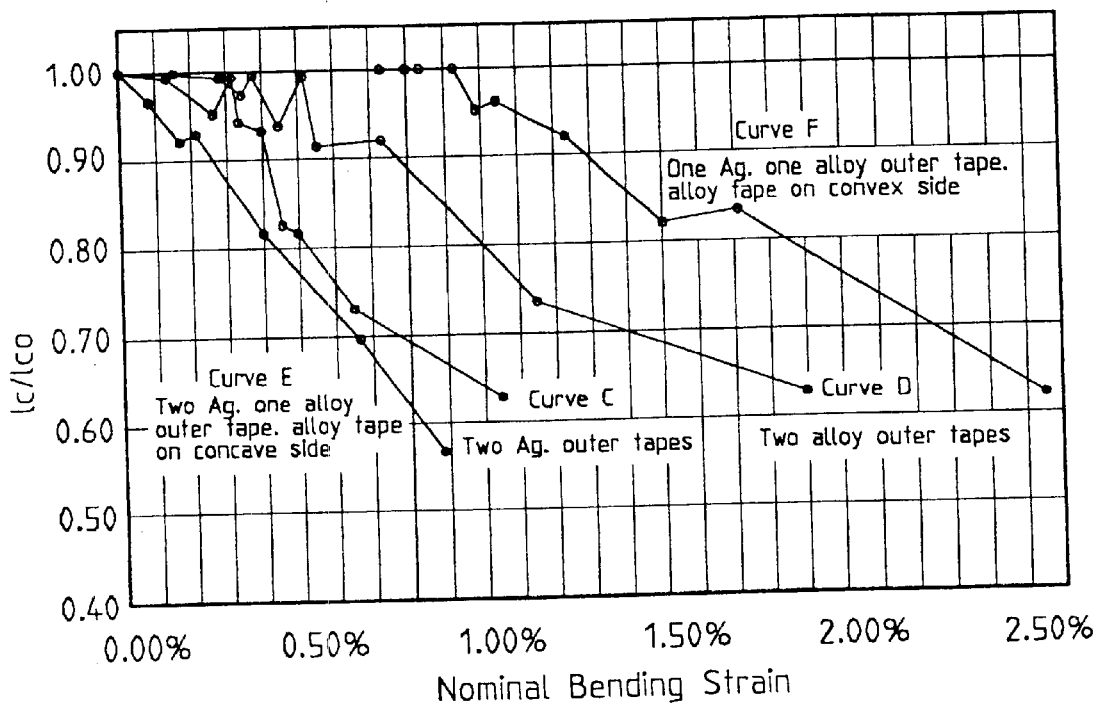
FIG. 7 presents a graph illustrating the effect on the critical current of a superconducting tape according to the invention as a function of nominal bending strain of examples according to the invention.

FIG. 7 shows more examples of the bending strain tolerance of tapes of the present invention. Curve C is the Ic versus $\epsilon$ (%) relationship of a composite superconducting tape with two multifilamentary superconducting tapes and two outer Ag tapes, curve D that of composite tape with two multifilamentary tapes and two Ag-Mg alloy tapes; curve E that of composite tape with two multifilamentary tapes, one outer Ag tape and one outer Ag-Mg alloy tape when the tape was bent with the Ag tape on the convex side; and curve F, the same as curve E, but with the Ag-Mg alloy tape on the convex side.

The data shown in FIGS. 6 and 7 strongly support the claims of the present invention that significant improved bending strain tolerance can be achieved when the composite tape has a stronger outer metal tape on the convex side.

Twisted (or untwisted) multifilamentary tapes, if desired with different numbers of filaments, different pitches and/or different twisting sense or direction, could also be used in making composite tapes in accordance with the invention.

Although the invention has been described with reference to specific examples, it will be appreciated by those skilled in the art that the invention may be embodied in many other forms.

What is claimed is:
1. A composite superconducting tape comprising:
   a plurality of constituent superconducting tapes, wherein the composite tape includes a pair of exposed opposite major faces; and
   at least one outer layer of metal tape overlying and bonded to one of the exposed major faces thereof, with the proviso that if there are two such metal tapes bonded to the major faces they differ in a common strength property for selectively displacing the neutral flexural plane of the plurality of superconducting tapes.
2. A composite superconducting tape according to claim 1, wherein the plurality of superconducting tapes are bonded.
3. A composite superconducting tape according to claim 1, wherein the plurality of superconducting tapes are diffusion-bonded, and wherein the superconducting tapes and the outer layer of metal tape are elongated and extend longitudinally.
4. A composite superconducting tape according to claim 1, wherein there are two metal tapes of different compositions.
5. A composite superconducting tape according to claim 1, wherein there are two metal tapes of the same composition but different thickness.
6. A composite superconducting tape according to claim 2 in which the constituent superconducting tapes are stacked in at least two parallel stacks.
7. A composite superconducting tape including:
   a plurality of constituent superconducting tapes, wherein the composite tape has two exposed opposite major faces and two opposite edges extend between the major faces, and wherein the composite tape has a flexural neutral plane extending substantially parallel to and intermediate to the major faces; and
   an outer layer of metal tape bonded to a first of the exposed major faces for selectively displacing the neutral flexural plane toward or away from the first major face.
8. A composite superconducting tape according to claim 7, further comprising a second metal tape bonded to a second of the exposed major faces.
9. A composite superconducting tape according to claim 8, wherein the first and second metal tapes possess different mechanical properties.
10. A composite superconducting tape according to claim 7, wherein the plurality of constituent superconducting tapes are arranged in at least one stack.
11. A composite superconducting tape according to claim 10, wherein all of the constituent superconducting tapes extend longitudinally.
12. A composite superconducting tape according to claim 8, wherein the second metal tape has a different composition than the first metal tape.
13. A composite superconducting tape according to claim 8, wherein the first and second metal tapes are of different thicknesses.
14. A composite superconducting tape according to claim 10, comprising a plurality of stacks disposed substantially parallel with respect to each other.
15. A composite superconducting tape according to claim 11, comprising a plurality of stacks disposed substantially parallel with respect to each other.
16. A composite superconducting tape according to claim 12, comprising a plurality of stacks disposed substantially parallel with respect to each other.
17. A composite superconducting tape according to claim 13, comprising a plurality of stacks disposed substantially parallel with respect to each other.

18. A composite superconducting tape according to claim 14, wherein each stack includes a first and second exposed major stack face, and wherein all of the first stack faces at least partially define one of the two exposed opposite major faces of the composite tape and wherein all of the second stack faces partially define a second of the two exposed opposite major faces of the composite tape.

19. A composite superconducting tape according to claim 14, wherein each stack includes a first and second exposed major stack face, and wherein all of the first stack faces substantially define one of the two exposed opposite major faces of the composite tape and wherein all of the second stack faces substantially define a second of the two exposed opposite major faces of the composite tape.

20. A composite superconducting tape according to claim 14, wherein all of the tapes within each stack are bonded together.

21. A composite superconducting tape according to claim 16, wherein the stacks are bonded together.

22. A composite superconducting tape according to claim 18, wherein the stacks are bonded together.

23. A composite superconducting tape according to claim 19, wherein the stacks are bonded together.

24. A composite superconducting tape according to claim 20, wherein the stacks are bonded together.

* * * * *